(12) United States Patent
Preuss et al.

(10) Patent No.: US 6,790,594 B1
(45) Date of Patent: Sep. 14, 2004

(54) HIGH ABSORPTION DONOR SUBSTRATE COATABLE WITH ORGANIC LAYER(S) TRANSFERRABLE IN RESPONSE TO INCIDENT LASER LIGHT

(75) Inventors: Donald R. Preuss, Rochester, NY (US); Fridrich Vazan, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/393,033

(22) Filed: Mar. 20, 2003

(51) Int. Cl.[7] .............................. G03F 7/11; G03F 7/09
(52) U.S. Cl. ............................... 430/272.1; 430/275.1; 430/276.1; 430/277.1; 430/278.1; 430/200; 430/207
(58) Field of Search ...................... 430/272.1, 275.1, 430/276.1, 277.1, 278.1, 200, 207

(56) References Cited

U.S. PATENT DOCUMENTS

| | | |
|---|---|---|
| 5,244,770 A | 9/1993 | DeBoer et al. |
| 5,688,551 A | 11/1997 | Littman et al. |
| 5,851,709 A | 12/1998 | Grande et al. |
| 5,920,080 A * | 7/1999 | Jones ........................... 257/40 |
| 5,994,835 A * | 11/1999 | Wilson et al. ............... 313/504 |
| 6,114,088 A | 9/2000 | Wolk et al. |
| 6,140,009 A | 10/2000 | Wolk et al. |
| 6,214,520 B1 | 4/2001 | Wolk et al. |
| 6,221,553 B1 | 4/2001 | Wolk et al. |
| 6,402,579 B1 * | 6/2002 | Pichler et al. ................ 445/24 |
| 6,488,555 B2 * | 12/2002 | Pichler et al. ................ 445/24 |
| 6,541,790 B1 * | 4/2003 | Pichler ......................... 257/40 |
| 6,558,820 B2 * | 5/2003 | Raychaudhuri et al. ...... 428/690 |
| 6,570,325 B2 * | 5/2003 | Graff et al. ................... 313/506 |
| 6,592,969 B1 * | 7/2003 | Burroughes et al. ........ 428/332 |
| 6,602,790 B2 * | 8/2003 | Kian et al. ................... 438/690 |

OTHER PUBLICATIONS

Introduction to Modern Optics, Reinhart and Winston, Inc. (1968), pp 95–100, 165–168.
Handbook of Optical Constants of Solids by Edward D. Palik, Academic Press Inc. (1985).
Handbook of Optical Constants of Solids II by Edward D. Palik, Academic Pres Inc. (1991).

* cited by examiner

*Primary Examiner*—John A. McPherson
*Assistant Examiner*—Amanda Walke
(74) *Attorney, Agent, or Firm*—Raymond L. Owens

(57) ABSTRACT

Making a high absorption donor substrate for providing one or more OLED materials to an OLED device by: providing an absorber anti-reflection layer over a transparent support element, the anti-reflection layer having the real portion of its index of refraction greater than 3.0, and a thickness near the first reflectivity minimum at the wavelength of interest; providing a metallic heat-absorbing layer over the anti-reflection layer for absorbing laser light which passes through the transparent support element and the anti-reflection layer; and selecting the transparent support element, the anti-reflection layer, and the metallic heat-absorbing layer to have an average reflectivity of less than 10%, and the micro reflectivity variation due to variations in the thickness of the transparent support element of less than 10% at the wavelength of interest; and providing one or more organic material layers in the absence of a binder material, over the metallic heat-absorbing layer.

13 Claims, 7 Drawing Sheets

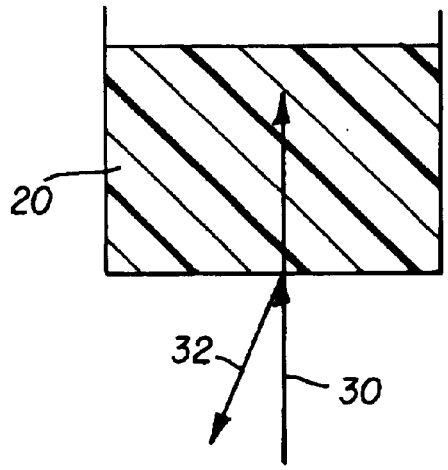
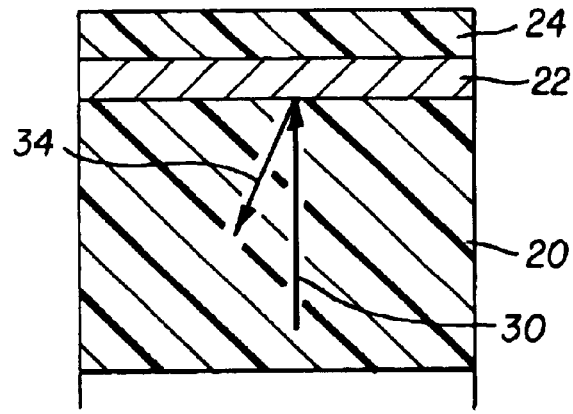
FIG. 4A  FIG. 4B
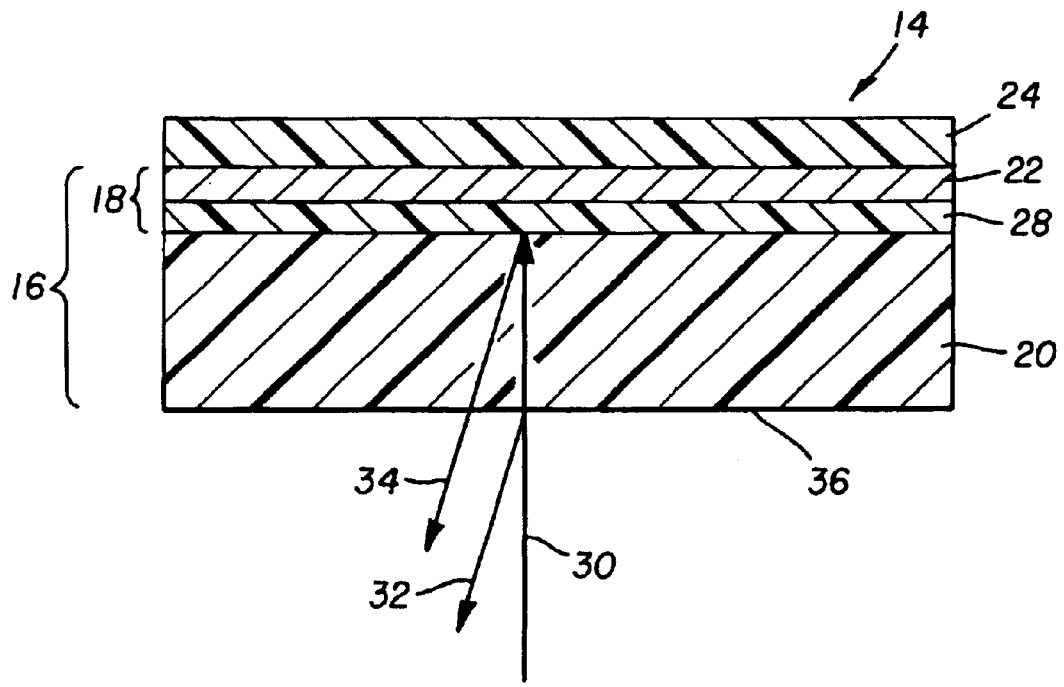
FIG. 5

HIGH ABSORPTION DONOR SUBSTRATE COATABLE WITH ORGANIC LAYER(S) TRANSFERRABLE IN RESPONSE TO INCIDENT LASER LIGHT

FIELD OF THE INVENTION

The present invention relates to thermal transfer of organic materials from a donor element to a receiving device, such as an OLED device.

BACKGROUND OF THE INVENTION

In color or full-color organic electroluminescent (EL) displays (also known as organic light-emitting diode devices, or OLED devices) having an array of colored pixels such as red, green, and blue color pixels (commonly referred to as RGB pixels), precision patterning of the color-producing organic EL media are required to produce the RGB pixels. The basic OLED device has in common an anode, a cathode, and an organic EL medium sandwiched between the anode and the cathode. The organic EL medium can consist of one or more layers of organic thin films, where one of the layers is primarily responsible for light generation or electroluminescence. This particular layer is generally referred to as the emissive layer of the organic EL medium. Other organic layers present in the organic EL medium can provide electronic transport functions primarily and are referred to as either the hole transport layer (for hole transport) or electron transport layer (for electron transport). In forming the RGB pixels in a full-color OLED display panel, it is necessary to devise a method to precisely pattern the emissive layer of the organic EL medium or the entire organic EL medium.

A suitable method for patterning high-resolution OLED displays has been disclosed in commonly-assigned U.S. Pat. No. 5,851,709 by Grande et al. this method is comprised of the following sequences of steps: 1) providing a substrate having opposing first and second surfaces; 2) forming a light-transmissive heat-insulating layer over the first surface of the substrate; 3) forming a light-absorbing layer over the heat-insulating layer; 4) providing the substrate with an array of openings extending from the second surface to the heat-insulating layer; 5) providing a transferable color-forming organic donor layer formed on the light-absorbing layer, 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Grande et al. approach is that patterning of an array of openings on the donor substrate is required. Another problem is that the requirement for precision mechanical alignment between the donor substrate and the display substrate. A further problem is that the donor pattern is fixed and cannot be changed readily.

Littman and Tang (commonly-assigned U.S. Pat. No. 5,688,551) teach the patternwise transfer of organic EL material from an unpatterned donor sheet to an EL substrate. A series of patents by Wolk et al (U.S. Pat. Nos. 6,114,088; 6,140,009; 6,214,520; and 6,221,553) teaches a method that can transfer the luminescent layer of an EL device from a donor element to a substrate by heating selected portions of the donor with a laser beam. Each layer is an operational or non-operational layer that is utilized in the function of the device.

In these processes a donor containing the electroluminescent materials is heated by radiation and transferred to a receiver which may already contain a portion of the active device. The device may then be finished by the application of further layers. This process allows the patterning of colors by the use of a suitable donor which contains an electron or hole conductors host and a dopant. The final light emitting device must have the dopant mixed together to give a good emission. It is difficult to co-evaporate two or more materials simultaneously and maintain a constant controlled ratio. The resulting emission from these radiation-transferred devices also have need for improved efficiency.

Deboer and Spahn (commonly-assigned U.S. Pat. No. 5,244,770) teaches a donor element for color transfer in the field of color printing. They introduce the concept of an anti-reflection layer located between a transparent support, and a heat absorbing metal layer. This element is used to transfer a dye layer comprising a binder and a sublimable dye. The use of a binder is common in the field of color printing, but is inappropriate in the fabrication of OLED devices. It is difficult to transfer an organic material without contamination from the binder. In a color print, low levels of contamination can be tolerated, but such contamination would be unacceptable in an electroluminescent device such as an OLED, compromising lifetime, efficiency, and appearance. Furthermore, the variety of systems covered by commonly assigned U.S. Pat. No. 5,244,770 are not uniformly appropriate for patterning a device such as OLED. As a manufacturing process, throughput is critical, and only the most absorptive donors are attractive, as they will maximize throughput in the manufacturing process. Finally, the preferred sublimation process of materials for a device such as OLED is frequently near the threshold power required for the transfer of material, due to the fact that excessive power can lead to contamination of the device, or degradation of the transferred material. In order to operate near the threshold of transfer, it is a requirement that the donor efficiency, and therefore the donor absorption be uniform over the area of the donor. This requirement is often frustrated by the interference of the laser light reflected off of the absorbing layer of the donor with the laser light reflected off of the air-support interface.

SUMMARY OF THE INVENTION

It is therefore an object of the present invention to provide a very high absorption laser thermal substrate with low micro absorption variation onto which dyes or other organic materials can be coated.

This object is achieved in a method of making a high absorption donor substrate which can be coated with one or more organic material layers and for use in providing one or more OLED materials to an OLED device in response to laser light substantially within a predetermined wavelength range, includes:

(a) providing a transparent support element;

(b) providing an absorber anti-reflection layer over the transparent support element, the anti-reflection layer selected to have the real portion of its index of refraction greater than 3.0, and a thickness selected to be near the first reflectivity minimum at the wavelength of interest;

(c) providing a metallic heat-absorbing layer over the anti-reflection layer for absorbing laser light which passes through the transparent support element and the anti-reflection layer;

(d) selecting the transparent support element, the anti-reflection layer, and the metallic heat-absorbing layer to have an average reflectivity of less than 10%, and the micro reflectivity variation due to variations in the thickness of the transparent support element of less than 10% at the wavelength of interest; and (e) providing one or more organic material layers in the absence of a binder material, over the metallic heat-absorbing layer which include organic material(s) which are transferable to an OLED device.

A tuned high absorption donor substrate for laser-thermal-transfer can have a high efficiency absorber which can absorb 95% to 100% of the light striking it. This improves optical efficiency of a donor element by a factor of two over simple donor substrates for laser-thermal-transfer with a simple metallic heat-absorbing layer as the absorber, and thus provides greater transfer efficiency at a given light intensity. The very low reflectivity absorber greatly reduces the variability in the absorption efficiency of the donor substrate, and allows a uniform transfer of organic material from a donor element made from the donor substrate even when operating near the transfer threshold. OLED materials are known to be sensitive to excessive heating, so the best transfer conditions are expected to be near the transfer threshold for a wide variety of systems. A donor with an average reflectivity of greater than only 10% can have a variability in the transfer threshold of up to 18%. Furthermore, since contamination is critical in electroluminescent devices such as an OLED, it is advantageous to perform transfers for OLED devices with an organic layer which is transferred in its entirety, as opposed to an organic layer with an inert binder which is either partially transferred or not transferred at all.

BRIEF DESCRIPTION OF THE DRAWINGS

FIGS. 4A and 4B are cross sectional representations of portions of a donor substrate element, demonstrating a) donor back surface reflectivity and b) donor absorber reflectivity;

FIG. 5 is a cross-sectional representation of a donor element with the addition of an anti-reflection layer in accordance with this invention;

DETAILED DESCRIPTION OF THE INVENTION

Figure 1:
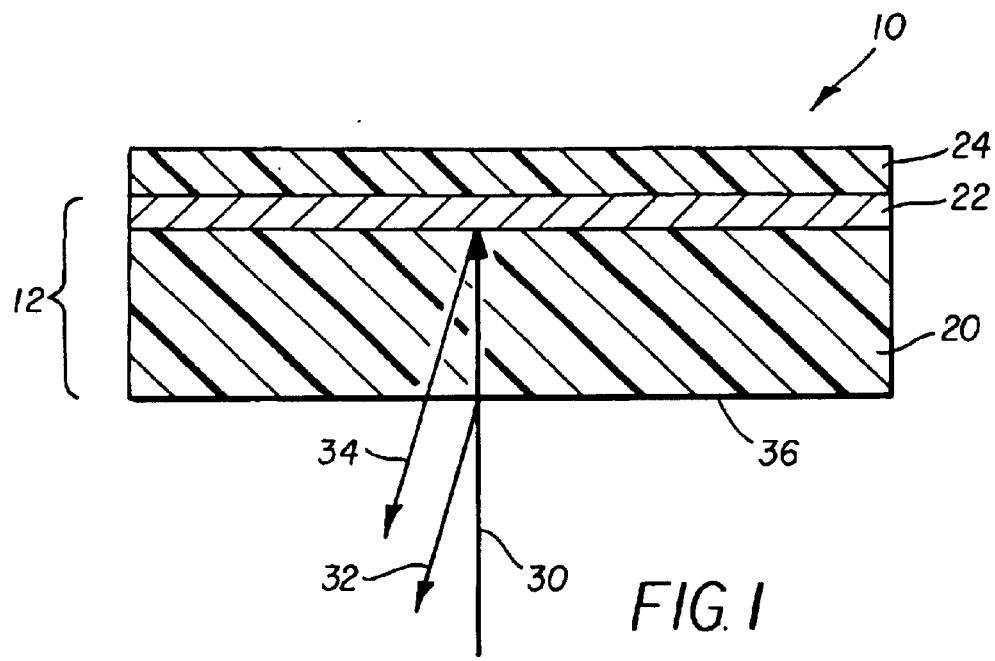
FIG. 1 is a cross-sectional representation of a prior art donor element with a metallic heat-absorbing layer showing reflections of incident light.

Desirable properties of a donor substrate are efficiency, and uniformity. FIG. 1 shows a simple donor substrate 12 consisting of a metallic heat-absorbing layer 22 in contact with a transparent support element 20 which can be plastic. The simple donor substrate 12 is capable of receiving an organic material layer 24, such that the combination of the simple donor substrate 12 and organic material layer 24 constitutes a simple donor element 10. Selected regions of the organic material layer can be transferred to a receiving device in response to exposure and subsequent heating by laser light 30 incident on the non-transfer surface 36 of the simple donor element 10.

The simple donor substrate 12 shown in FIG. 1 suffers from both poor efficiency and poor uniformity. The poor efficiency is a result of the intrinsic reflectivity of most metals. Typical metal reflectivities are on the order of 50% to 98%. Since reflected light cannot contribute to the heating of the metallic heat-absorbing layer 24, one must compensate by supplying an abundance of laser power. In order to understand the nature of the poor uniformity of the simple donor substrate in FIG. 1, one must look more carefully into the behavior of light when incident on an element consisting of multiple thin layers.

The behavior of light incident on an element consisting of multiple thin (uniform) layers is well understood in the field of optics. Each layer in the element can be characterized by a thickness (t) and a refractive index (n). In the case of a non-absorbing material, the refractive index is a real number. In the case of an absorbing material such as a metal, the refractive index is a complex number consisting of a real and an imaginary part. This complex index is usually denoted as N (capital), for which the real component is n (lower case), and the imaginary component is k (lower case), such that $N=n+i*k$. If N and t are known for every layer, it is possible to precisely calculate the quantity of light reflected, absorbed, and transmitted by the multi-layer element, using the equations and methodology presented, for example, in Fowles (Fowles, Grant R., *Introduction to Modern Optics*, Reinhart and Winston, Inc., (1968), pp. 95–100, 165–168)

Returning to FIG. 1, incident laser light 30 first encounters the non-transfer surface 36 of the transparent support 20. A portion of the incident laser light 30 is reflected 32 from the non-transfer surface. Another portion of the incident laser light 30 enters the transparent support element, and encounters the metallic heat-absorbing layer 22. If the metallic heat-absorbing layer 22 is sufficiently thick (typically greater than 200 nm) an insignificant fraction of the light is transmitted (not shown). A portion of the incident laser light 30 which encounters the metallic heat-absorbing layer 22 is absorbed by that layer, and converted to heat. Another portion of the laser light reflected back toward the non-transfer surface of the simple donor substrate 12. The reflected laser light 34 leaving the simple donor substrate 12 occupies the same space as the reflected laser light 32, and combines with it. If the two reflected laser lights are coherent, as is usually the case for laser light, the amplitudes of the electric fields will add, causing combined magnitude of the two reflected laser lights to depend on their relative phases.

The phase of the reflected laser light 34 differs from the phase of the reflected laser light 32 based on the distance it has traveled through the transparent support element 20. There is an additional phase shift incurred when reflected laser light 34 reflects from the metallic heat-absorbing layer 22. The consequence of this behavior is that the combined magnitude of the two reflected laser lights depends on the precise thickness of the transparent support element 20. If no significant portion of the laser light is transmitted, than variations in the energy reflected must be complemented by variations in the energy absorbed in the metallic heat-absorbing layer 22. Since the thickness of the transparent support element 20 cannot generally be controlled to the degree required, this variation is a major source of poor uniformity of the absorption by the simple donor substrate 12.

Quantitative calculations of this effect have been made. In general, the precise mathematical formulae become complex for any but the simplest of optical systems, and will not be reproduced here. In fact, most people skilled in the art rely on computer models to compute the behavior of multi-layer optical systems.

Example 1 (prior art; computational): As a specific example of a simple donor substrate 12, consider a metallic absorbing layer 22 of optically thick chromium layer coated onto a transparent support element 20 with a refractive index of 1.5.

$n_s=1.5$ (subscript s indicates transparent support element) Most useful support materials have a refractive index between 1.4 and 1.75. Also, consider a laser wavelength of 800 nm.

$$\lambda=800 \text{ nm}$$

This is a typical wavelength for a high power diode laser. The literature value for the refractive index for chromium at this wavelength is $N_m=4.18+4.34i$ (Edward D. Palik, *Handbook of Optical Constants of Solids*, Academic Press Inc., (1985) and Edward D. Palik, *Handbook of Optical Constants of Solids II*, Academic Press Inc., (1991) and references therein, hereafter referred to as "Palik").

$n_m=4.18$ (subscript m indicates metallic light absorbing layer 22)

$k_m=4.34$ (subscript m indicates metallic light absorbing layer 22)

Figure 2:
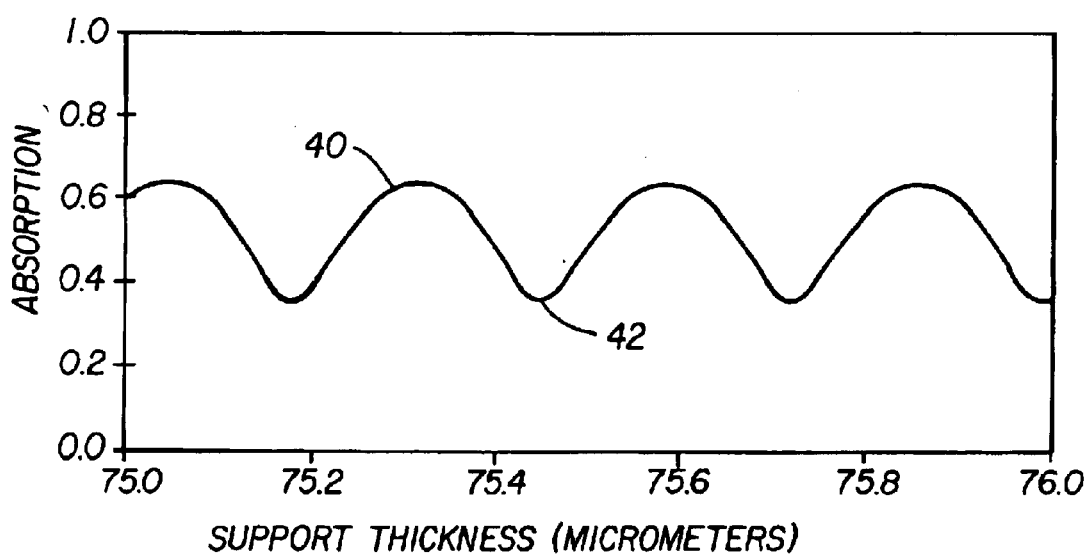
FIG. 2 is a graph of the varying absorption of light by the metallic heat-absorbing layer as a function of the transparent plastic support element thickness by the prior art.

FIG. 2 depicts the absorption curve which is the result of applying the methodology in Fowles to the optical system in Example 1. The absorption peak 40 occurs whenever the thickness of the transparent support element 20 is such that the relative phases of the two reflected lights in an odd multiple of pi (out of phase), and the absorption valley 42 occurs whenever the thickness of the transparent support element 20 is such that the relative phases of the two reflected lights is an even multiple of pi (in phase). The absorption level of the simple donor substrate 12 at the absorption peak will be denoted as $A_{peak}$, and the absorption level of the simple donor substrate 12 at the absorption valley 42 will be denoted as $A_{valley}$. From the absorption curve in FIG. 2, one can see that a variation of only 0.1 micrometer in the substrate thickness will cause the full absorption variation, and no reasonably priced substrate will be held to these tolerances. This means that this effect represents an uncontrolled variation in the absorption of the simple donor substrate 12.

The amount of variability in the absorption of the simple donor substrate 12 due to this interference effect can be quantified by defining a quantity called the micro absorption variation (MAV) as:

$$MAV=(A_{peak}-A_{valley})/(A_{peak}+A_{valley})$$

Where $A_{peak}$ and $A_{valley}$ are the in phase and out of phase absorption of the simple donor substrate as shown in FIG. 2. Notice that since $A_{peak}$ and $A_{valley}$ must be between 0 and 1, that MAV must also be between 0 and 1, where a perfectly uniform donor would have MAV=0. Notice that MAV would be expected to be directly proportional to the variation in sensitivity of the simple donor substrate 12. For present example, $A_{peak}$ is 64.1% and $A_{valley}$ is 36.1%, making MAV equal to 27.9%. In order to transfer all of the organic material from a donor element, one must overcome the poor absorption at the worst spot . . . in this case $A_{valley}$. This makes the overall donor substrate efficiency of this donor equal to $A_{valley}$, or only 36.1%.

Figure 3:
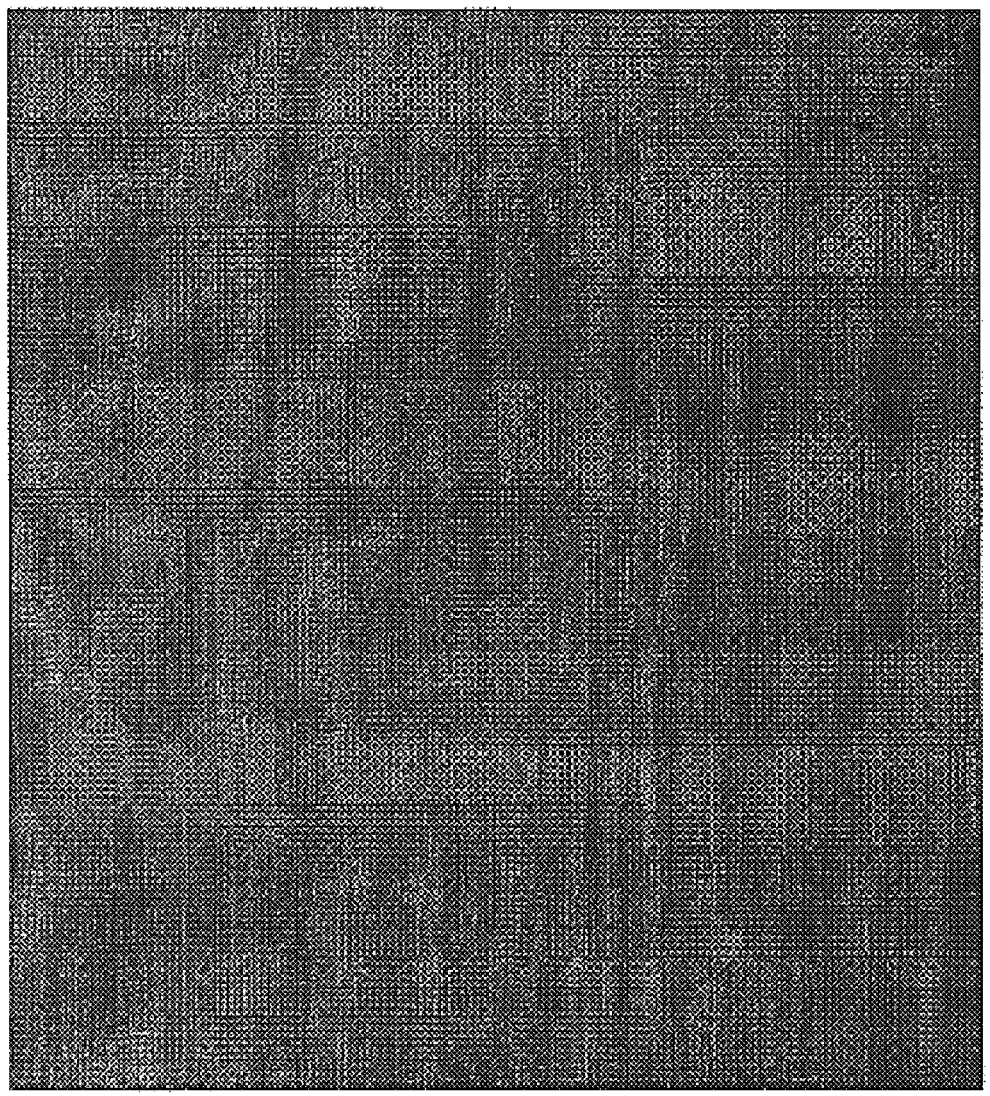
FIG. 3 is a representation of a photograph of the substrate side of a prior art donor substrate consisting of Cr on Kapton illuminated with monochromatic light.

As an illustration of this effect, FIG. 3 is a representation of a photograph taken of a simple donor substrate as depicted in FIG. 1. The simple donor substrate 12 was chromium coating on a 75 micrometer thick Kapton® support. The lighting was a from a light box with two uncoated fluorescent bulbs, a white plastic diffuser plate, and a green plastic filter, which provides a diffuse green illumination with a wavelength which was measured to be 548 nm and a bandwidth which was measured to be 8 nm. The light and dark fringes in FIG. 3 correspond to the peaks and valleys in the graph of FIG. 2, as the thickness of the Kapton® varies across its surface. The fringes varied from about 1 to 5 mm in separation. This optical arrangement is slightly different than the one which would occur in laser writing, but the fringe effect is similar. When a minimum of light is reflected (dark fringe), a maximum of light is absorbed, and the simple donor substrate 12 would have enhanced sensitivity. Similarly, when a maximum of light is reflected (bright fringe), a minimum of light is absorbed, and the simple donor substrate 12 would have reduced sensitivity. This variation would be undesirable for the purpose of laser thermal transfer using a simple donor substrate 12.

Although the overall behavior of the optical system depicted in FIG. 1 is determined by the interference of reflected laser light 32 and reflected laser light 34, as seen in FIG. 3, one can calculate the magnitude of each of these reflected lights independently as if there were no interference. Referring now to FIG. 4A, if one eliminates reflected laser light 34 by assuming that there is no metallic absorbing layer 22, and that the transparent support element 20 is semi-infinite in extent, one can compute a quantity equal to the magnitude of reflected laser light 34 divided by the incident laser light 30, which will be referred to as the "donor back surface reflectivity". Similarly, referring to FIG. 4B, if one eliminates the donor back surface reflectivity by assuming that the transparent support element 20 is semi-infinite in extent toward the back, then the intensity of the reflected laser light 34 divided by the intensity of the incident laser light 30 will be referred to as the "donor absorber reflectivity". As a matter of further convenience, the fraction of incident laser light 30 absorbed by the donor absorber will be referred to as the "donor absorber efficiency". Again, referring the structure in Example 1, optical calculations reveal that the donor back surface reflectivity is 4.0%, the donor absorber reflectivity is 50.9%, making the donor absorber efficiency equal to 49.1%. Calculations also indicate that $A_{peak}$ is 63.9% and $A_{valley}$ is 35.8%, resulting in a MAV of 28.2%

There are two ways to reduce the MAV of a donor. One is to reduce or eliminate the donor back surface reflectivity, and the other is to reduce or eliminate the donor absorber reflectivity. The reduction of the donor back surface reflectivity can be accomplished by applying an anti-reflection coating onto the non-transfer side of the donor substrate. This will be referred to as a back surface anti-reflection layer. This well known solution can be accomplished by coating a single quarter wavelength layer of a low refractive index material onto the non transfer side of the donor substrate. A single layer back surface anti-reflection coating is not fully effective. It is well known that an ideal single layer anti-reflection coating applied to a dielectric must have a refractive index equal in value to the square root of the refractive index of the dielectric. Typical values of the refractive index of the transparent support element, $n_s$, range from 1.4 to 1.75, requiring that the refractive index for the donor back surface anti-reflection layer to be the appropriate value between 1.18 and 1.32. The best low index material for this purpose is known in the art to be $MgF_2$ with a refractive index of 1.37, which cannot be a perfect match for any of the typical supports, and therefore results in a non-ideal anti-reflection layer.

Example 2 (prior art; computational): A structure identical to the one proposed in Example 1 has a quarter wavelength layer of MgF2 (148 nm) applied to the non-transfer surface 36 depicted in FIG. 1. One calculates that the donor back surface reflectivity is reduced from 4.0% to 1.25%. As a result, $A_{peak}$ is 58.7%, $A_{valley}$ is 42.5%, and the MAV is reduced from 28.2% to 15.5%. The effectiveness of this approach would improve as $n_s$ increases toward the ideal value of 1.88. One could reduce the MAV to zero by using a two layer anti-reflection coating on the non-transfer side of the simple donor substrate 12. This approach to reducing MAV is undesirable because it is not fully effective unless multiple layers are used, and because the complete donor substrate now involves coating materials on both sides of the transparent support element 20. It also requires coating ceramic materials which makes e-beam evaporation and dc sputtering unattractive deposition methods, thereby increasing production costs.

A better solution for reducing the MAV is to reduce or eliminate the donor absorber reflectivity. This can be accomplished by using the formulation shown in FIG. 5. In this formulation, a high absorption donor element 14, and more specifically a high absorption donor substrate 16 is fabricated by including an anti-reflection layer between the transparent support element 20 and the metallic heat-absorbing layer 22. The anti-reflection layer in this location will be referred to as the absorber anti-reflection layer 28. The combination of the metallic heat-absorbing layer 22 and the absorber anti-reflection layer 28 will be referred to as the high efficiency absorber 18. If the material for the absorber anti-reflection layer 28 is properly selected, it will eliminate or greatly reduce the donor absorber reflectivity. The refractive index of material selected to act as the absorber anti-reflection layer 28 ($N_a=n_a+ik_a$ where the subscript a refers to the absorber anti-reflection layer 28) will be a complicated function of the complex refractive index of the metallic heat-absorbing layer 22, ($N_m=n_m+ik_m$), and of the refractive index of the transparent support element 20, ($n_s$). In the event that the metallic heat-absorbing layer 22 is not thick enough to be completely opaque, it can also impact the ideal selection of the material for the absorber anti-reflection layer 28.

Example 3 (present invention; computational): A high absorption donor substrate 16 according to FIG. 5 was modeled. The transparent support element 20 was selected to be polycarbonate. The absorber anti-reflection layer 28 was selected to be amorphous silicon, as one might obtain from sputtering or e-beam evaporation, and the metallic heat-absorbing layer 22 was optically thick chromium (200 nm thick), also as one might obtain from sputtering or e-beam evaporation. In this computational example, the optical constants used were the published values, typical of bulk materials (Palik and references therein). Specifically:

| | |
|---|---|
| $n_s = 1.58$ | (polycarbonate, typical value) |
| $n_a = 3.89$ | (amorphous silicon, Palik) |
| $k_a = 0.15$ | (amorphous silicon, Palik) |
| $n_m = 4.18$ | (chromium, Palik) |
| $k_m = 4.34$ | (chromium, Palik) |
| $\lambda = 800$ nm | |

The calculation indicated that a 36.2 nm layer of amorphous silicon was the optimum tuning thickness. The donor back surface reflectivity was 5.1%, and the donor absorber reflectivity was virtually zero (0.003%). $A_{peak}$ was 94.99% and $A_{valley}$ of 94.90% resulting in MAV equal to 0.05%.

The performance of Examples 1, 2 and 3 are summarized in Table 1. Of particular note is the low MAV for the high efficiency formulation, indicating a spatially uniform donor absorption level, and the high donor substrate efficiency, indicating a reduction in the amount of laser energy to effect a 100% transfer of organic material. The high efficiency formulation is clearly superior.

TABLE 1

| Ex. # | Formulation | Donor Back Surface Reflectivity | Donor Absorber Efficiency | MAV | Donor Substrate Efficiency |
|---|---|---|---|---|---|
| 1 | simple | 4% | 50.1% | 28.2% | 36.1% |
| 2 | simple with back surface anti-reflection layer | 1.25% | 50.9% | 15.5% | 42.5% |
| 3 | high efficiency | 5.1% | 100% | 0.003% | 94.9% |

One final point to note in regard to Example 3. Silicon is not completely transparent. An ideal back surface anti-reflection layer should be non-absorbing, but, as we will see, the absorber anti-reflection layer may have significant absorption and still function quite well.

The published values of the optical constants for thin films are often measured from bulk materials. The actual optical constants for thin films can be dependant on the conditions under which they are prepared, and often vary somewhat from the published values. For this reason, it is convenient to tune the anti-reflection layer thickness empirically. This methodology does not provide an independent measure of the actual film thickness, nor the actual optical constants of the coated layers. These could be obtained by profilometry and ellipsometry respectively, but to fabricate a practical device, one can use published optical values, and computer modeling to predict the performance of a tuned system, and then one fabricates that system by adjusting the thickness of the absorber anti-reflection layer empirically to achieve optimum system performance which will approximate the performance predicted by the model. Small discrepancies are attributed to differences between the actual and bulk optical constants.

Example 4 (present invention; experimental): Referring to FIG. 5, a high absorption donor substrate 16 was fabricated by applying a nearly ideal index matched absorber anti-reflection layer 28 onto a transparent support element 20.

Figure 6:
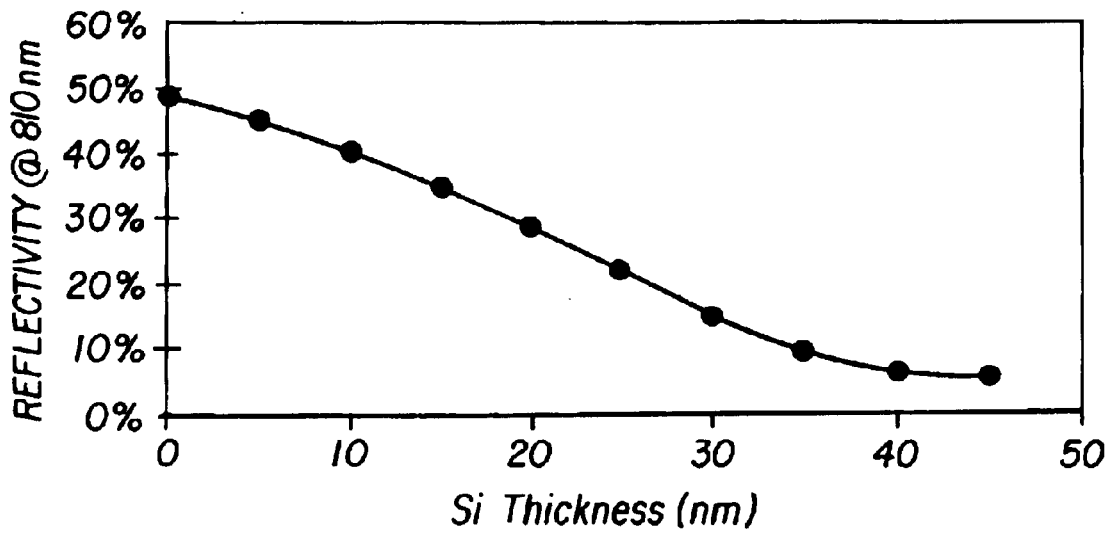
FIG. 6 is a graph depicting experimental reflectivity data for Si—Cr on Polycarbonate as a function of Si thickness.

The transparent support element 20 was 1.2 mm thick polycarbonate. The absorber anti-reflection layer 28 was 99.999% silicon with boron doped to a resistivity of 0.020 ohm-cm and was dc-sputtered in 6 mTorr of argon gas. The boron was included to reduce charging during the dc sputtering process, and is not believed to affect the optical properties of the silicon. A series of samples were prepared varying the thickness of the silicon layer in the range of 0 nm and 45 nm. The precise thicknesses were only estimated from the sputtering times. A metallic heat-absorbing layer 22 of pure Cr metal (99.98%) was then sputtered in 6 mTorr of argon gas, onto the absorber anti-reflection layer 28 to an approximate thickness of 60 nm. The reflectivities of the entire thickness series of high absorption donor substrates 16 was measured in a Cary 2500 spectrophotometer with 800 nm light. The results are shown in the graph in FIG. 6. The best result was for a silicon thickness of 45 nm. This is slightly higher than the result predicted by Example 3, of 36.2 nm. The discrepancy could be the inaccuracy of the experimental thickness measurement, or, more likely, the difference between the bulk values for the optical constants reported in the literature, and the actual values obtained by sputtering. In any event, the best tuned high absorption donor substrate 16 had a measured reflectivity at 800 nm of 5.3%. It should be noted that the exposed sample area in the Cary 2500 spectrophotometer is a circle about 15 mm in diameter. Referring to the image in FIG. 3, one is measuring a reflectivity average over many fringes, so the measured values are average reflectivities.

Example 5 (experimental): The best coatings applied in Example 4 (45 nm Si and 60 nm Cr), were applied to the surface of a 75 micrometer thick UDEL® support. The UDEL support is reported by the supplier to have an index of refraction of 1.633 which results in a donor back surface reflectivity of 5.8%. The measured reflectivity of the high absorption donor substrate on the Cary 2500 at 800 nm was 5.7%. Clearly, there was a negligible amount of reflection from the high efficiency absorber. One could also apply a donor back surface anti-reflection coating of $MgF_2$ to any of the high efficiency donor substrates, and produce a donor substrate with a total reflectivity of approximately 1.25%, and a low MAV. The benefit of such a coating on an already high efficiency donor substrate would be marginal relative to the cost.

Example 6 (present invention; experimental): A high absorption donor substrate 16 was fabricated in the manner of Example 5, except that the chromium layer was coated to only 40 nm thickness. A layer of 20 nm of 2-tert-butyl-9, 10-bis(2-naphthyl)anthracene (TBADN) was vacuum deposited onto the chromium layer, followed by a second layer of 0.25 nm of tetra-tert-butyl-perylene (TBP) to create a blue high absorption donor element 14 for an OLED process. These materials were transferred from the blue high absorption donor element 14 to an in-process OLED device using a scanning infrared laser of 810 nm wavelength to heat the blue high absorption donor element 14. The laser spot was 0.010 mm by 2.56 mm, and had a total output power of 1.5 W. It was swept at a rate of 140 mm/s in the direction of the 0.01 mm dimension, thereby exposing the honor element to 4.2 $mJ/mm^2$ of energy in a time period of approximately 70 microseconds. This exposure was sufficient to transfer the organics from the donor sheet to the in process OLED device. Completion of the device produced a blue color element as would be expected for this chemical combination.

Example 7 (present invention; experimental): A simple donor element 10 was coated in the manner of Example 6, except that the silicon layer which served as the absorber anti-reflection layer 28 was omitted, creating a blue simple donor element 10 for an OLED process. These materials were transferred from the blue simple donor element 10 to an in-process OLED device using a scanning infrared laser of 810 nm wavelength to heat the blue simple donor element 10. The laser spot was spot was 0.010 mm by 2.56 mm, and had a total output power of 3.0 W. It was swept at a rate of 220 mm/s. This exposure (5.3 $mJ/mm^2$ in a time period of 45 microseconds) was not sufficient to transfer any the organics from the donor sheet to the in process OLED device. Completion of the device produced a green color clement as would be expected for an undoped OLED device. The same simple blue donor element 10 was employed at a lower sweep rate of 140 mm/s in the direction of the 10 micrometer dimension, thereby exposing the donor element to 8.4 $mJ/mm^2$ of energy in a time period of 70 microseconds. This exposure was sufficient to transfer the organics from the donor sheet to the in process OLED device. Completion of the device produced a blue color element as would be expected for this chemical combination. The simple donor element 10 of this example required nearly twice the energy density to accomplish the same transfer as the high absorption donor element 14 in Example 6.

Figure 7:
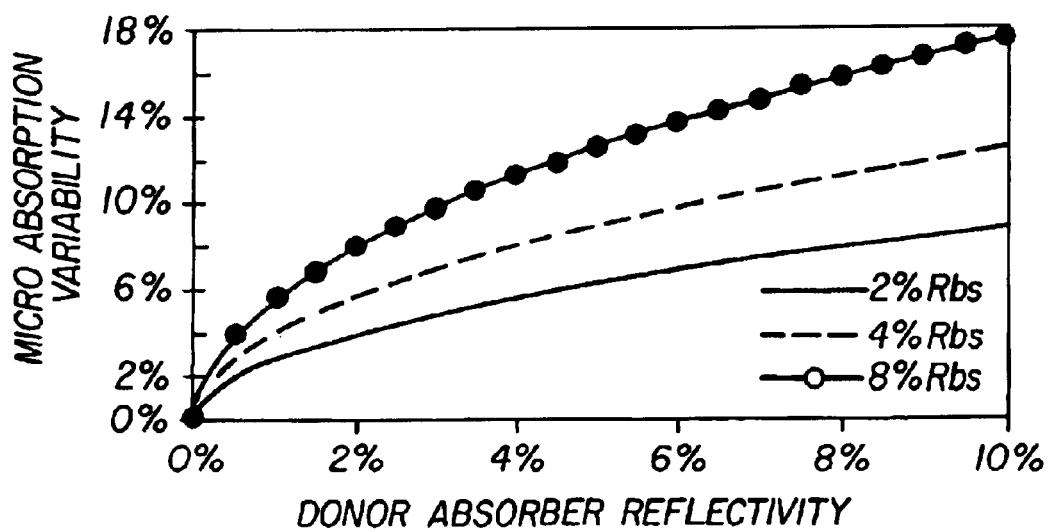
FIG. 7 is a graph depicting the calculated MAV as a function of donor absorber reflectivity for some typical values of the donor back surface reflectivity.

As seen in the above computational examples, one must obtain a very efficient absorber in order to achieve a significant reduction in the micro absorption variability (MAV). There is a relation between the values of the donor back surface reflectivity, the donor absorber reflectivity, and the micro absorption reflectivity. FIG. 7 shows a graph with a series of plots derived using the computational methods for thin film stacks described earlier. For a high absorption donor substrate with a refractive index of 1.5, the donor back surface reflectivity is computed to be 4%. Referring to FIG. 7, if one requires that the MAV be less than 10%, then on must design the system such that the donor absorber reflectivity is less than 6%. If the high absorption donor substrate had a refractive index of 1.79 (an extremely high value), then the donor back surface reflectivity would be 8%, and the donor absorber reflectivity would have to be less than about 3%. The higher the index of the donor support, the more efficient the donor absorber must be to achieve low MAV.

The primary interest for low variability high absorption donor substrates 16 is currently in the near infrared, because this is the region where the most powerful low cost lasers are available. Calculations indicate that in order to achieve an efficient donor absorber, the absorber anti-reflection layer 28 needs to have a very high index of refraction, $n_a$. There are a limited number of materials which can be used to make absorber anti-reflection layers 28 which are sufficiently efficient to achieve low MAV in a simple, inexpensive, manufacturable element.

First consider the variables which define the system. Materials for the transparent support element 20 could be plastics or glasses, and should be essentially non-absorbing in the wavelength range of the laser. Most such materials have an index of refraction ($n_s$) in the range of 1.4 to 1.7, and since they are non-absorbing, have $k_s$ values close to 0. The metals which can be utilized as the metallic heat-absorbing layer 22 have a complex refractive index (because they are absorbing) with values of $n_m$ ranging from about 2 (e.g. Pd) to about 4.5 (e.g. Cr). The $k_m$ values for metals range from about 3 (e.g. Mo and Al) to about 6 (Pt and Ir). The noble metals (Cu, Ag, and Au) are exceptions to these ranges (n<0.3; k>3.0), but will not be considered in this section. The alkali metals (Li, Na, K, Cs) are similar to the noble metals in optical properties, but are unsuitable for reactivity reasons.

Example 8 (present invention, computational): Using the optical modeling techniques described earlier, one can determine the optical properties of an absorber anti-reflection layer which will provide an efficient high absorption donor substrate with low micro absorption variability.

First, consider average or typical values for transparent support element 20 and the metallic heat-absorbing layer 22. Also, consider only a non-absorbing anti-reflection layer. Specifically, $n_s$=1.55 (n for the transparent support element)

$k_m$=4.0 (k for the metallic heat-absorbing layer)

$n_m$=3.0 (n for the metallic heat-absorbing layer)

$k_a$=0.0 (k for the absorber anti-reflection layer)

Thin film calculations, show that the refractive index of the absorber anti-reflection layer 28 must be greater than 3.3 to achieve 95% donor absorber efficiency, and greater than 3.7 to achieve 98% donor absorber efficiency. This eliminates from consideration all of the conventional dielectric insulators usually used thin film applications, such as $MgF_2$ (n=1.37), $SiO_2$ (n=1.45), MgO (n=1.73), $Al_2O_3$ (n=1.76), SiO (n=1.9 to 2), $Si_3N_4$ (n=2.0) and $TiO_2$ (n=2.5 to 2.8) to name a few. What does offer a solution to this materials problem is two classes of materials: semiconductors and chalcoginides.

There are variety of such materials which satisfy the constraints on optical properties in the near infrared. Considering the wavelength range near 800 nm, one can obtain from the compilation by Palik, the list of materials in Table 2.

TABLE 2

| Material | Wavelength (nm) | n | k |
|---|---|---|---|
| AlAs | 817 | 0.8173 | ???? |
| AlSb | 827 | 3.54 | 0.0001 |
| $As_2S_3$ (crystalline) | 811 | 3.03 | 0.00006 |
| $As_2S_3$ (amorphous) | 800 | 2.52 | 0 |
| CdSe | 810 | 2.646 | 0 |
| CdS (thin film) | 800 | 2.32 | 0.43 |
| CdTe (thin film) | 827 | 2.98 | 0.319 |
| CdTe (crystalline) | 810 | 2.878 | 0.08 |
| GaAs | 816 | 3.672 | 0.083 |
| GaP | 805 | 3.191 | 0 |
| GaSb | 800 | 4.4396 | ??? |
| Ge | 805 | 4.684 | 0.316 |
| InAs | 816 | 3.72 | 0.444 |
| InSb | 816 | 4.442 | 0.659 |
| InP | 806 | 3.459 | 0.209 |
| PbSe | 827 | 4.64 | 2.64 |
| PbS | 827 | 4.5 | 0.008 |
| PbTe | 827 | 3.8 | 0.003 |
| Si | 816 | 3.681 | 0.013 |
| Si (amorphous) | 827 | 3.86 | 0.08 |
| Se | 805 | 3 | 0.00001 |
| Te | 820 | 5.78 | 0.895 |

At this time, only non-absorbing materials are being considered, so we can arbitrarily limit the k values to 0.2 or less, and n values to 3.3 or more. This results in a shorter list of preferred materials including AlSb, $As_2S_3$, GaAs, PbS, PbTe and Si. These materials could all work optically, but it is desirable to employ less toxic materials which do not have Sb, As, or Pb in them. This reduces the most preferred list to Si. Furthermore, since the high absorption donor substrate 16 will be heated by a laser during the transfer process, it is also desirable to select the metallic light absorbing layer 22 and donor absorber anti-reflection layer 28 to be heat resistant.

The range of $n_m$, the real part of the refractive index for the metallic light absorbing layer 22 for available materials spans the range from about 2 to 4.5. To see how this selection affects the choice of materials for the absorber anti-reflection layer 28, thin film calculations were made on Example 8 above, except that the value of nm was allowed to vary. Table 3 is the result of these calculations. In Table 3 and all subsequent tables, no upper range is indicated for the refractive index of the absorber anti-reflection layer 28, if that limit is greater than 10.

TABLE 3

$N_s = 1.55; k_m = 4; k_a = 0$

| $n_m$ | $A_a = 95\%$ | $A_a = 98\%$ |
|---|---|---|
| 2.0 | $4.2 < n_a$ | $5.0 < n_a$ |
| 2.5 | $3.6 < n_a$ | $4.1 < n_a < 9.0$ |
| 3.0 | $3.3 < n_a < 8.8$ | $3.7 < n_a < 6.4$ |
| 3.5 | $3.1 < n_a < 6.7$ | $3.5 < n_a < 5.5$ |
| 4.0 | $3.0 < n_a < 5.9$ | $3.4 < n_a < 5.0$ |
| 4.5 | $3.0 < n_a < 5.5$ | $3.3 < n_a < 4.8$ |

As Table 3 makes clear, metals with a low n require a higher index anti-reflection material in order to provide an efficient donor absorber. Amorphous silicon, for example, with an $n_a$ of 3.9 would not be adequate to work with a metal such as Pd with $n_m$ of 2.06. to make a high absorption donor substrate 16 with a 98% donor absorber efficiency. High index metals increase the working space for selecting an absorber anti-reflection material. It is possible to have an absorber anti-reflection material with the refractive index too high, but this is not often the case until absorbing materials are considered.

Consider now, the effect of $k_m$ on this operating space. A value of 4 was selected for the "typical" system in Example 8 above. Values for actual metals range from 3 to 6. Table 4 shows the result of thin film calculations for these extremes in $k_m$. The trend remains the same as in Table 3, in that increased

TABLE 4

$N_s = 1.55; k_a = 0$

| | $k_m = 3$ | | $k_m = 6$ | |
|---|---|---|---|---|
| $n_m$ | $A_a = 95\%$ | $A_a = 98\%$ | $A_a = 95\%$ | $A_a = 98\%$ |
| 2.0 | $3.3 < n_a$ | $3.9 < n_a$ | $6.1 < n_a$ | $7.3 < n_a$ |
| 2.5 | $2.9 < n_a$ | $3.3 < n_a < 6.9$ | $5.1 < n_a$ | $5.9 < n_a$ |
| 3.0 | $2.7 < n_a < 6.8$ | $3.0 < n_a < 5.1$ | $4.5 < n_a$ | $5.2 < n_a < 9.2$ |
| 3.5 | $2.6 < n_a < 5.4$ | $2.9 < n_a < 4.5$ | $4.2 < n_a < 9.6$ | $4.7 < n_a < 7.7$ |
| 4.0 | $2.6 < n_a < 4.8$ | $2.9 < n_a < 4.2$ | $4.0 < n_a < 8.1$ | $4.4 < n_a < 6.8$ |
| 4.5 | $2.6 < n_a < 4.7$ | $2.9 < n_a < 4.1$ | $3.8 < n_a < 7.3$ | $4.2 < n_a < 6.3$ | values of $n_m$ allow the use of lower index materials for the absorber anti-reflection layer 28. We now see that lower values of $K_m$ also allow the use of lower index materials for the absorber anti-reflection layer 28. The conclusion is that a metallic heat absorbing layer 22 of high n and low k still requires an absorber anti-reflection layer index of nearly 3 in order to achieve an absorber efficiency of 98%.

Finally, consider the effect of $n_s$, the index of refraction of the transparent support element material. The value used in the "typical" system in Example 8 was 1.55. Now consider the extreme values of 1.4 and 1.7, which spans most available materials. These calculations are shown in Table 5. From these results, one learns that a

TABLE 5

| | $k_m = 4; k_a = 0$ | | | |
|---|---|---|---|---|
| | $n_s = 1.4$ | | $n_s = 1.7$ | |
| $n_m$ | $A_a = 95\%$ | $A_a = 98\%$ | $A_a = 95\%$ | $A_a = 98\%$ |
| 2.0 | $3.8 < n_a$ | $4.5 < n_a$ | $4.6 < n_a$ | $5.6 < n_a$ |
| 2.5 | $3.3 < n_a$ | $3.8 < n_a < 7.2$ | $3.9 < n_a$ | $4.5 < n_a$ |
| 3.0 | $3.1 < n_a < 7.1$ | $3.4 < n_a < 5.6$ | $3.5 < n_a$ | $4.0 < n_a < 7.5$ |
| 3.5 | $2.9 < n_a < 5.9$ | $3.3 < n_a < 5.0$ | $3.3 < n_a < 7.8$ | $3.7 < n_a < 6.1$ |
| 4.0 | $2.9 < n_a < 5.3$ | $3.2 < n_a < 4.6$ | $3.2 < n_a < 6.6$ | $3.6 < n_a < 5.5$ |
| 4.5 | $2.8 < n_a < 5.0$ | $3.1 < n_a < 4.4$ | $3.1 < n_a < 6.0$ | $3.5 < n_a < 5.1$ | lower index for the transparent support element 20 allows the use of a lower index absorber anti-reflection layer material.

Summarizing the learning from the above calculations, the widest range of materials available for use as the absorber anti-reflection layer 28 is achieved by selecting the material for the metallic light absorbing layer 22 to have a high n and a low k, and selecting the refractive index for the transparent support element 20 to have a low n. Table 2 indicates that not many metals satisfy this criterion, and that perhaps the best choice (osmium; n=2.99, k=1.7) is prohibitively expensive and difficult to fabricate. Similarly, high temperature transparent support materials frequently have high n values (e.g. polyimides and polysulfones). Practical systems of choice will frequently require moving away from these teachings, and selecting very high index materials for the absorber anti-reflection layer 28 to compensate, or sacrificing a few percent in donor absorber efficiency.

We now turn to one final variable to consider in the effort to construct a useful high absorption donor substrate 16. Up to this point, we have assumed that the absorber anti-reflection layer 28 does not have any substantial absorption. In Examples 3, 4, 5 and 6, sputtered film of amorphous silicon was used quite successfully as the absorber anti-reflection layer 28. Amorphous silicon is reported to have an absorption coefficient, $k_m$ of 0.08 at the wavelength of interest, 810 nm. Referring back to Table 2, which lists the n and K values for a variety of semiconductors and other materials near 810 nm wavelength, the k values range from 0 to 2.6. Anti-reflection layers with k values of 0 would seem to be advantageous since the purpose of an anti-reflection layer is to remove detrimental reflections, or to increase the amount of light being transmitted, or both. In the case of a high absorption donor substrate 16, the primary goal is to eliminate a detrimental reflection (in order to reduce the MAV). If some of the laser light is converted to heat in the absorber anti-reflection layer 28, that energy is still useful in that the absorber anti-reflection layer 28 is in intimate contact with the metallic light absorbing layer 22, and will contribute significantly to the temperature rise of the latter. Therefore, for this application, it is acceptable for the absorber anti-reflection layer 28 to have a significant absorption, so long as the optical criteria can be met, and the reflected light from the donor absorber is small.

For typical metals (excluding the noble metals, Cu, Ag, Au) the limiting value of k is about 0.5. Above this value, there is insufficient light reflecting off of the metallic light absorbing layer 22 to meet the anti-reflection condition. For extremely good reflectors such as Cu, Ag, Au and Al, k values in the range of 1 to 1.5 can still provide efficient anti-reflection layers, whereas k values of 0 are ineffective. For metallic heat absorbing materials which are not as efficient reflectors, such as Cr, k values of 0 are effective (all previous examples), but k values as high as 0.5 can also effective. This knowledge makes the use of germanium a possibility, and extends the use of amorphous silicon well into the visible.

Germanium has a k value (see Table 2) of 0.316 near 810 nm. Table 6 is a reproduction of Table 3, except that $k_a$ is now set to 0.3 to emulate germanium.

TABLE 6

| | $N_s = 1.55; k_m = 4; k_a = 0.3$ | |
|---|---|---|
| $n_m$ | $A_a = 95\%$ | $A_a = 95\%$ |
| 2.0 | $2.5 < n_a$ | $3.2 < n_a$ |
| 2.5 | $2.1 < n_a$ | $2.8 < n_a < 6.4$ |
| 3.0 | $n_a < 6.7$ | $2.6 < n_a < 5.0$ |
| 3.5 | $n_a < 5.5$ | $2.5 < n_a < 4.5$ |
| 4.0 | $n_a < 5.0$ | $2.4 < n_a < 4.2$ |
| 4.5 | $n_a < 4.7$ | $2.4 < n_a < 4.1$ |

When the absorber anti-reflection layer 28 itself becomes absorbing, the high values of the refractive index that we struggled to achieve in the non-absorbing cases relax even further, and the possibility that the absorber antireflecting material has too high of an index becomes feasible. In fact, and inspection of the materials in Table 2 indicate that absorbing materials (higher k) tend to have higher values of n.

Example 9 (present invention, computational): A high absorption donor substrate 16 according to FIG. 5 was modeled. The parameters were identical to Example 3, except the values for germanium were used instead of those for silicon. In this case the absorber anti-reflection layer 28 had significant absorption. In this computational example, the optical constants used were the published values, typical of bulk materials (Palik and references therein). Specifically:

| | |
|---|---|
| $n_s = 1.58$ | (polycarbonate, typical value) |
| $n_a = 4.684$ | (germanium, Palik) |
| $k_a = 0.316$ | (germanium, Palik) |
| $n_m = 4.23$ | (chromium, Palik) |
| $k_m = 4.34$ | (chromium, Palik) |
| $\lambda = 810$ nm | |

The calculation indicated that a 27.0 nm layer of germanium was the optimum tuning thickness. The donor back surface reflectivity was 5.1%, and the donor absorber reflectivity was 3.1%. $A_{peak}$ was 99.74% and $A_{valley}$ of 85.13% resulting in MAV equal to 7.90%. This is three times more uniform than the simple donor substrate 12 in Example 1, but much worse than the Si—Cr donor in Example 8. The problem is that Ge actually has too high an index to match with chromium. Table 6 indicates that in order to achieve a donor absorber reflectivity of less than 2%, the refractive index, $n_a$ should be between 2.4 and 4.1. Again referring to Table 6, a better material would be nickel, with $n_m = 2.48$ and $k_m = 4.38$.

Example 10 (present invention, computational): A high absorption donor substrate 16 according to FIG. 5 was modeled. The parameters were identical to Example 9, except the values for nickel were used instead of those for chromium. In this computational example, the optical constants used were the published values, typical of bulk materials (Palik and references therein). Specifically:

| | |
|---|---|
| $n_s = 1.58$ | (polycarbonate, typical value) |
| $n_a = 4.684$ | (germanium, Palik) |
| $k_a = 0.316$ | (germanium, Palik) |
| $n_m = 2.48$ | (nickel, Palik) |
| $k_m = 4.38$ | (nickel, Palik) |
| $\lambda = 810$ nm | |

The calculation indicated that a 23.4 nm layer of germanium was the optimum tuning thickness. The donor back surface reflectivity was 5.1%, and the donor absorber reflectivity was 0.05%. $A_{peak}$ was 95.83% and $A_{valley}$ of 93.99% resulting in MAV equal to 0.71%. This is as good a match as silicon-chromium in Example 3.

Figure 8:
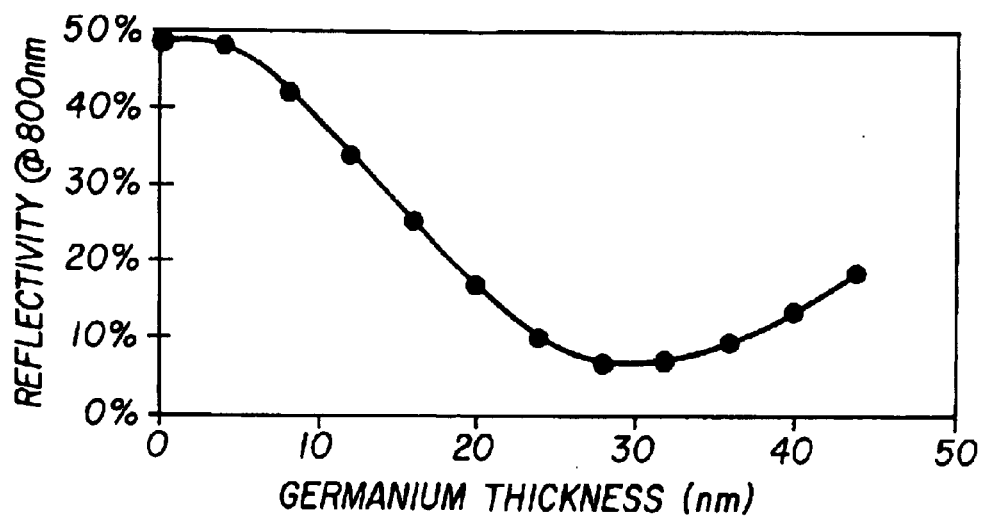
FIG. 8 is a graph depicting experimental reflectivity data for Ge—Ni on Polycarbonate as a function of Ge thickness.

Example 11 (present invention, experimental): Referring to FIG. 5, a high absorption donor substrate 12 was fabricated by applying a nearly ideal index matched absorber anti-reflection layer 28 onto a transparent support element 20. The transparent support element 20 was 1.2 mm thick polycarbonate. The absorber anti-reflection layer 28 was 99.999% germanium with antimony doped to a resistivity of 0.020 ohm-cm and was dc-sputtered in 8 mTorr of argon gas. The antimony was included to reduce charging during the dc sputtering process, and is not believed to affect the optical properties of the germanium. A series of samples were prepared varying the thickness of the germanium layer in the range of 0 nm and 44 nm. The precise thicknesses were only estimated from the sputtering times. A metallic heat-absorbing layer 22 of pure nickel metal (purity unknown) was then sputtered in 6 mTorr of argon gas, onto the absorber anti-reflection layer 28 to an approximate thickness of 100 nm. The reflectivities of the entire thickness series of high absorption donor substrates 16 were measured on an uncalibrated spectrophotometer with 800 nm light. The results are shown in the graph in FIG. 8. The best result was for a germanium thickness of 30 nm. This is slightly higher than the result predicted by Example 10 (23.4 nm). This discrepancy could be the inaccuracy of the experimental thickness measurement, or the difference between the bulk values for the optical constants reported in the literature, and the actual values obtained by sputtering. The best tuned high absorption donor substrate 16 was measured on Cary 2300 spectrophotometer and found to have reflectivity at 800 nm of 7.2%. Since the donor back surface reflectivity (based on the index of refraction of polycarbonate) is 5.1%, the donor absorber reflectivity is only about 2%. It should be noted that the exposed sample area in the is a circle about 15 mm in diameter. Referring to the image in FIG. 3, one is measuring a reflectivity average over many fringes, so the measured values are average reflectivities.

Example 12 (present invention, experimental): Based on the results from Example 11, coatings of 30 nm Ge and 60 nm Ni applied to the surface of a 75 micrometer thick UDEL® support. The resulting coating had the same appearance as the corresponding coating in Example 11. A layer of 20 nm of 2-tert-butyl-9,10-bis(2-naphthyl)anthracene (TBADN) was vacuum deposited onto the chromium layer, followed by a second layer of 0.25 nm of tetra-tert-butyl-perylene (TBP) to create a high efficiency donor element 14 for an OLED process. These materials were transferred from the blue high efficiency donor element 14 to an in-process OLED device using a scanning infrared laser of 810 nm wavelength to heat the blue high efficiency donor element 14. The laser spot was 0.010 mm by 5.12 mm, and had a total output power of 3.0 W. It was swept at a rate of 187 mm/s in the direction of the 0.01 mm dimension, thereby exposing the blue high efficiency donor element 14 to 3.4 mJ/mm² of energy in a time period of approximately 70 microseconds. This exposure was sufficient to transfer the organics from the donor sheet to the in process OLED device. Completion of the device produced a blue color element as would be expected for this chemical combination.

Figure 9:
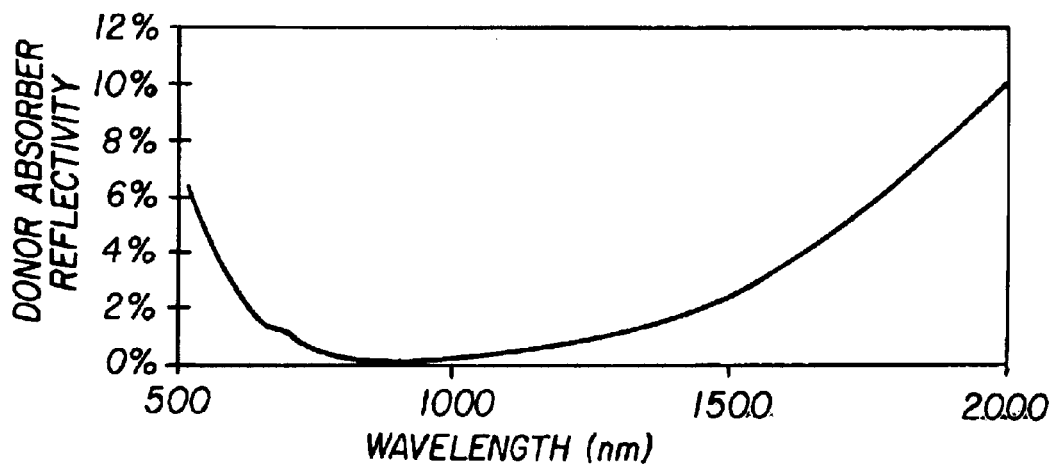
FIG. 9 is a graph depicting the calculated values for the lowest achievable donor absorber reflectivity for Si—Cr high absorption donor substrates, as a function of wavelength.
Figure 10:
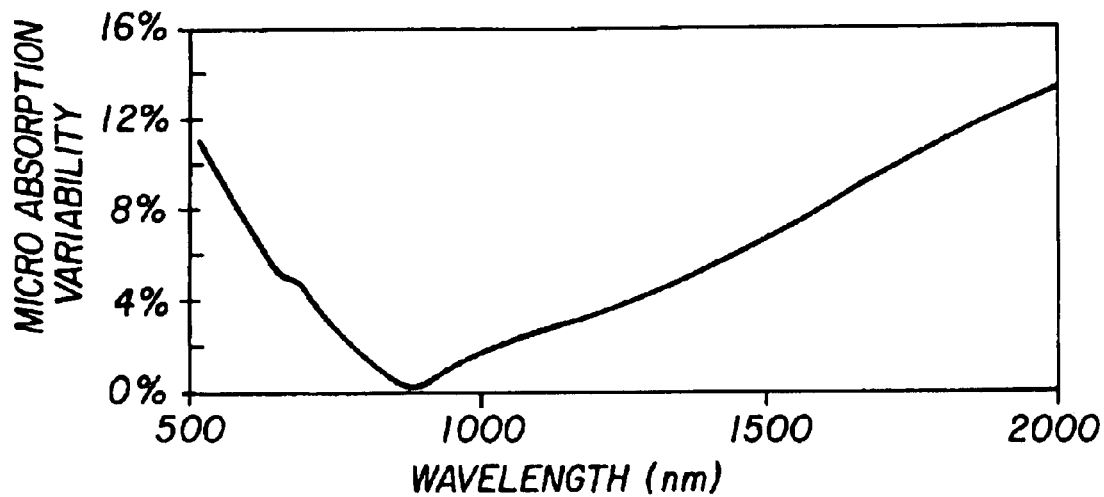
FIG. 10 is a graph depicting the calculated values for the lowest achievable MAV for Si—Cr high absorption donor substrates as a function of wavelength.

A particular system for creating a high absorption donor substrate with low MAV may work at a given wavelength, but will not be able to perform as efficiently at other wavelengths. For example, a properly tuned Si—Cr system can achieve virtually zero donor absorber reflectivity at 800 nm. FIG. 9 is a chart showing the donor absorber reflectivity for a properly tuned (optimum silicon thickness) high absorption donor substrate of Si—Cr on polycarbonate, as a function of wavelength. The optical constants used were those published in Palik for amorphous silicon, and chromium metal. At wavelengths of light significantly different from 810 nm, even though the Si thickness is optimized, the donor absorber reflectivity can be as high as 10%. This is because the optical properties of the Si and Cr are not properly matched at those wavelengths. FIG. 10 shows the calculated MAV for this system as a function of wavelength. This MAV of the high absorption donor substrate deteriorates even faster than the reflectivity curve at other wavelengths.

Figure 11:
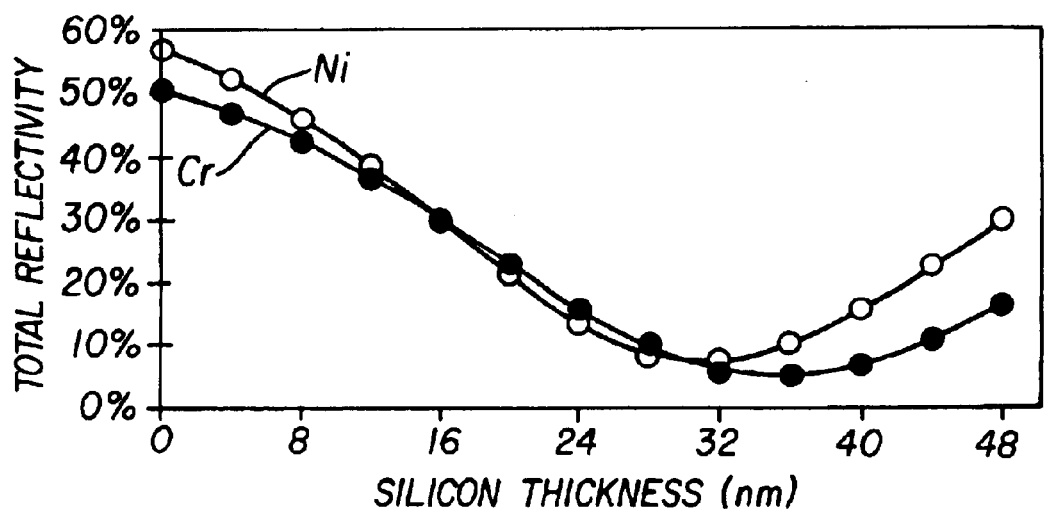
FIG. 11 is a graph depicting the calculated values for the total reflectivity at 800 nm for ideal coatings of Si—Ni and Si—Cr on polycarbonate, as a function of Si thickness.

The final aspect to be addressed in detail is the difficulty in obtaining the bulk values of refractive index for evaporated thin films. Evaporation methods frequently result in films of low density, and low refractive index relative to published bulk quantities. Furthermore, some materials, such as silicon, can react with background gases in the coating apparatus, such as oxygen or water vapor, to create partially oxidized films. These also have lower indices than bulk silicon. In order to demonstrate this effect, consider a series of coatings on polycarbonate ($n_s$=1.58) of amorphous silicon ($n_a$=3.89; $k_a$=0.10, followed by a low index metal such as nickel ($n_m$=2.48; $k_m$=4.38). FIG. 11 shows the calculated total reflectivity of 800 nm light from this series as a function of silicon thickness. The lowest total reflectivity for the high index chromium metallic heat absorbing layer is 5.1%, resulting nearly entirely from the donor back surface reflectivity. The lowest total reflectivity for the low index nickel metallic heat absorbing layer 22 is 7.3%.

Figure 12:
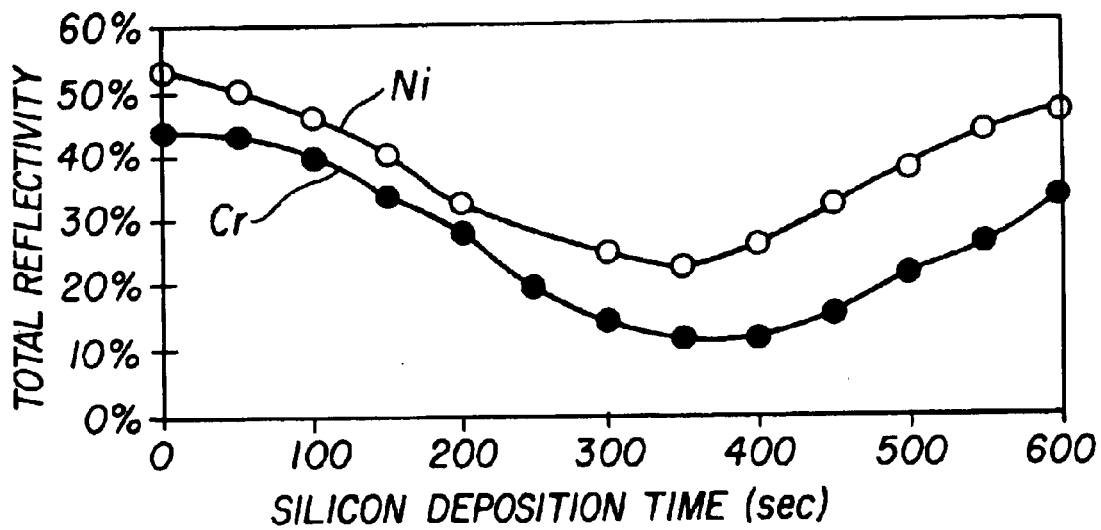
FIG. 12 is a graph depicting the experimental values for the total reflectivity at 800 nm for actual coatings of Si—Ni and Si—Cr on polycarbonate for a slow Si deposition.

These precise samples were fabricated in a coating machine with a base pressure of about 5×10⁻⁶ Torr. The deposition rate of the silicon was rather slow, at only 1 Angstroms/sec. The total reflectivity of the samples (at 800 nm) were measured, and are represented in FIG. 12. The minimum values for total reflectivity at 800 nm wavelength of the silicon-nickel and silicon-chromium high absorption donor substrates were 22.9% and 11.7% respectively. One can use optical modeling as in previous examples to estimate that the refractive index of the slow deposited silicon was on the order of 2.6 to 2.9. This is just an estimate, since the actual refractive index of the nickel and chromium are also in doubt.

Figure 13:
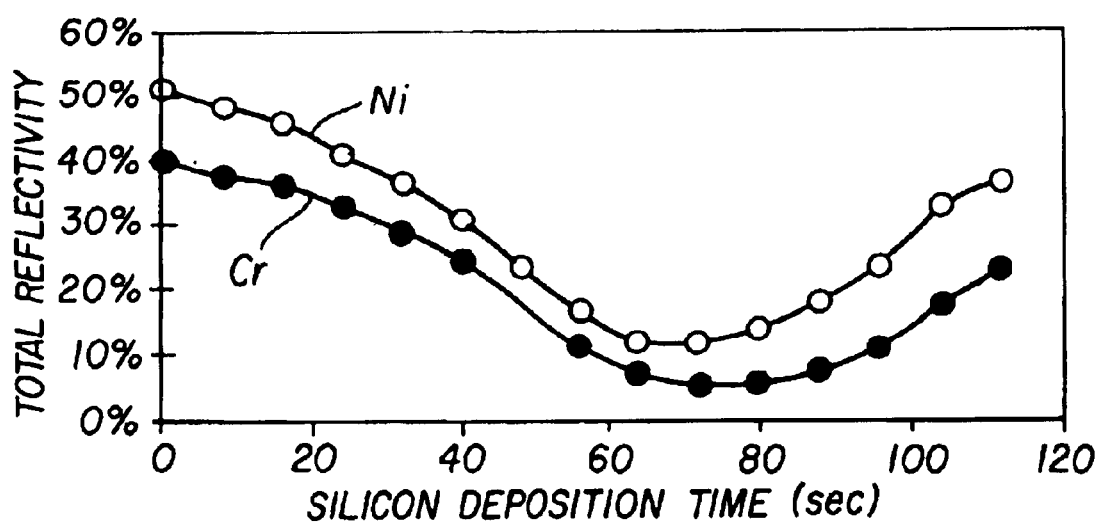
FIG. 13 is a graph depicting the experimental values for the total reflectivity at 800 nm for actual coatings of Si—Ni and Si—Cr on polycarbonate for a rapid Si deposition.

The same set of samples were fabricated in the same coating machine, except this time the silicon deposition rate was increased to 5 Angstroms/second. The total reflectivities were again measured, and are depicted in FIG. 13. The minimum values for total reflectivity at 800 nm wavelength of the silicon-nickel and silicon-chromium high absorption donor substrates were 11.7% and 5.2% respectively. Optical modeling suggest that the silicon deposited at high speed had a refractive index on the order of 3.4 to 3.6. In that it is a problem to coat high index silicon, the use of a high index metal such as chromium offers a considerable advantage in obtaining a high efficiency donor substrate 16, as well as a donor substrate with a low MAV (high uniformity).

The invention has been described in detail with particular reference to certain preferred embodiments thereof, but it will be understood that variations and modifications can be effected within the spirit and scope of the invention.

PARTS LIST

10 Simple donor element
12 Simple donor substrate
14 high absorption donor element
16 high absorption donor substrate
18 high efficiency absorber
20 transparent support element
22 metallic heat-absorbing layer
24 organic material layer
28 absorber anti-reflection layer
30 incident laser light
32 reflected laser light
34 reflected laser light
36 non-transfer surface
40 absorption peak
42 absorption valley

What is claimed is:

1. In a method of making a high absorption donor substrate which can be coated with one or more organic material layers and for use in providing one or more OLED materials to an OLED device in response to laser light substantially within a predetermined wavelength range, includes:

(a) providing a transparent support element;

(b) providing an absorber anti-reflection layer over the transparent support element, the anti-reflection layer selected to have the real portion of its index of refraction greater than 3.0, and a thickness selected to be near the first reflectivity minimum at the wavelength of interest;

(c) providing a metallic heat-absorbing layer over the anti-reflection layer for absorbing laser light which passes through the transparent support element and the anti-reflection layer;

(d) selecting the transparent support element, the anti-reflection layer, and the metallic heat-absorbing layer to have an average reflectivity of less than 10%, and the micro reflectivity variation due to variations in the thickness of the transparent support element of less than 10% at the wavelength of interest; and (e) providing one or more organic material layers in the absence of a binder material, over the metallic heat-absorbing layer which include organic material(s) which are transferable to an OLED device.

2. The method of claim 1 wherein the real part of the refractive index of the metallic heat absorbing layer is larger than 3.0.

3. The method of claim 1 wherein the wavelength of interest is less than 1100 nm and greater than 550 nm.

4. The method of claim 1 wherein the metallic heat absorbing layer includes Cr.

5. The method of claim 1 wherein there is one organic material layer including two different organic materials.

6. The method of claim 1 wherein the absorber anti-reflection layer includes silicon and the metallic heat-absorbing layer includes chromium.

7. The method of claim 1 wherein the anti-reflection layer includes a mixture of Si and Ge.

8. The method of claim 1 wherein the metallic heat-absorbing layer includes Ag, Al, Au, Be, Co, Cr, Cu, Fe, Ir, Mo, Nb, Ni, Pt, Rh, Ta, Pd, V, or W, or mixtures thereof.

9. The method of claim 2 wherein the metallic heat-absorbing layer includes Be, Cr, V, Mo Pt, or W, or mixtures thereof.

10. The method of claim 1 wherein the metallic heat-absorbing layer includes Ni and the anti-reflection layer includes Ge.

11. The method of claim 1 wherein the transparent plastic support element is less than 200 micrometers thick.

12. The method of claim 1 wherein the transparent plastic support element is polyimide, polysulfone, polyetherimide, polyvinylidinefluoride or polymethylpentene, or mixtures thereof.

13. A high absorption donor substrate prepared according to claim 1.

* * * * *